United States Patent
Richter et al.

(10) Patent No.: US 11,296,054 B2
(45) Date of Patent: Apr. 5, 2022

(54) POWER CONVERTER MODULE AND METHOD FOR PRODUCTION THEREOF

(71) Applicants: Fraunhofer-Gesellschaft, Munich (DE); Bayerische Motoren Werke Aktiengesellschaft, Munich (DE); FRAUNHOFER-GESELLSCHAFT ZUR FöRDERUNG DER ANGEWANDTEN FORSCHUNG E.V., Munich (DE)

(72) Inventors: Rene Richter, Munich (DE); Thomas Schimanek, Wörthsee (DE); Maximillian Hofmann, Erlangen (DE); Florian Hilpert, Erlangen (DE); Andreas Schletz, Erlangen (DE); Christoph Bayer, Erlangen (DE); Uwe Waltrich, Erlangen (DE)

(73) Assignees: Fraunhofer-Gesellschaft, Munich (DE); Bayerische Motoren Werke Aktiengesellschaft, Munich (DE)

( * ) Notice: Subject to any disclaimer, the term of this patent is extended or adjusted under 35 U.S.C. 154(b) by 109 days.

(21) Appl. No.: 16/620,318

(22) PCT Filed: Jun. 5, 2018

(86) PCT No.: PCT/EP2018/064728
§ 371 (c)(1),
(2) Date: Dec. 6, 2019

(87) PCT Pub. No.: WO2018/224480
PCT Pub. Date: Dec. 13, 2018

(65) Prior Publication Data
US 2020/0152611 A1      May 14, 2020

(30) Foreign Application Priority Data

Jun. 6, 2017 (DE) ................. 10 2017 209 515.6

(51) Int. Cl.
| | | |
|---|---|---|
| *H01L 25/07* | (2006.01) | |
| *H01L 25/18* | (2006.01) | |
| *H02M 7/00* | (2006.01) | |

(52) U.S. Cl.
CPC ............ *H01L 25/072* (2013.01); *H01L 25/18* (2013.01); *H02M 7/003* (2013.01); *H01L 2224/48091* (2013.01); *H01L 2224/49111* (2013.01)

(58) Field of Classification Search
CPC ...... H02M 7/003; H01L 25/072; H01L 25/18; H01L 2224/48091; H01L 2224/49111
(Continued)

(56) References Cited

U.S. PATENT DOCUMENTS

| 9,106,124 B2 * | 8/2015 | Bayerer | ................ H01L 25/162 |
| 2013/0056755 A1 * | 3/2013 | Hatai | ................... H01L 23/645 257/77 |

(Continued)

FOREIGN PATENT DOCUMENTS

| DE | 000004421319 A1 | 12/1995 |
| DE | 102010002627 A1 | 9/2011 |

(Continued)

OTHER PUBLICATIONS

International Searching Authority, Seach Report and Written Opinion issued in PCT/EP2018/064728 dated Sep. 24, 2018 (11 pages).

*Primary Examiner* — Yemane Mehari
(74) *Attorney, Agent, or Firm* — Wood Herron & Evans LLP (57) ABSTRACT

A power semiconductor module, as well as a corresponding method of manufacture, are provided. The power semiconductor module has a plurality of power switches. A first subset of the power switches forms part of a first electrical current branch. A second subset of the power switches forms (Continued)

part of a second electrical current branch. Within the current branches, the associated power switches are arranged symmetrically with respect to the DC voltage contacts and are connected in such a way that a current density which is formed in the individual current paths which are respectively assigned to one of the power switches is at least substantially homogeneously distributed during the high frequency operation of the power semiconductor module and/or in the operation of the power switches with high voltage gradients.

22 Claims, 3 Drawing Sheets

(58) Field of Classification Search
USPC .................................................. 363/123, 147
See application file for complete search history.

(56) References Cited

U.S. PATENT DOCUMENTS

| | | |
|---|---|---|
| 2013/0343108 A1 | 12/2013 | Shepard |
| 2014/0252410 A1* | 9/2014 | Laschek-Enders ..... H01L 21/56 257/141 |
| 2016/0043616 A1 | 2/2016 | Krishnamurthy et al. |
| 2017/0077044 A1* | 3/2017 | Soyano ................... H01L 23/48 |

FOREIGN PATENT DOCUMENTS

| | | |
|---|---|---|
| DE | 102012218868 B3 | 11/2013 |
| DE | 102013003527 A1 | 9/2014 |
| DE | 112015000156 T5 | 6/2016 |
| DE | 202016102722 U1 | 6/2016 |
| EP | 3032581 A1 | 6/2016 |
| EP | 3147941 A1 | 3/2017 |
| JP | 2007012721 A | 1/2007 |

* cited by examiner

POWER CONVERTER MODULE AND METHOD FOR PRODUCTION THEREOF

CROSS-REFERENCE TO RELATED APPLICATIONS

This application is a national phase entry of, and claims priority to, International Application No. PCT/EP2018/064728, filed Jun. 5, 2018, which claims priority to German Patent Application No. 10 2017 209 515.6, filed Jun. 6, 2017. The above-mentioned patent applications are incorporated herein by reference in their entireties.

TECHNICAL FIELD

The invention relates to a power semiconductor module, and in particular, relates to a drive converter module for operating a vehicle drive, as well as a method of manufacture for such a power semiconductor module and a vehicle with such a power semiconductor module.

BACKGROUND

Electric circuits are known from power electronics which can be used to control the transport of electric current. By current converters, as they are referred to, it is possible to convert types of electric current into one another, or characteristic parameters such as frequency or voltage can be changed. Particular types of power converters, such as rectifiers or inverters, can convert, into a DC voltage, an AC voltage that is being made available, or can convert, into an AC voltage, a DC voltage that is being made available.

These electric circuits play an important role in particular in the operation of electric machines, such as three-phase motors, and in energy storage technology. They are therefore of particular importance in the field of electromobility, where electric current is made available in the form of direct current from an energy storage device and is used in the form of alternating current in order to drive a vehicle, or where, in the recuperation, as it is referred to, the drive serves as a generator for electric alternating current, which is rectified so that the energy storage device can be recharged with direct current.

The technical progress in the field of power electronics has generated switching elements based on semiconductors with a wide band gap (wide band gap semiconductors), such as silicon carbide, gallium nitride or gallium arsenide, in particular power switches, which can be switched at particularly high frequencies, such as at above 100 kHz, in particular at above 1 MHz, and/or at particularly high voltage gradients, such as at above 10 V/ns, in particular at above 100 V/ns, and can advantageously be used in the electric circuits mentioned above. However, at the high frequencies and switching speeds that are possible as a result, it is increasingly likely for frequency dependent effects to occur which can impair the conduction of electric current in a current converter module in an undesirable way.

Thus, it would be desirable to provide an improved power semiconductor module in which frequency dependent and/or voltage gradient dependent negative influences on the power semiconductor module, in particular on its energy efficiency and efficient use of space and/or on its lifetime, can be reduced or even eliminated.

SUMMARY

To achieve these and other objectives, a first embodiment of the invention relates to a power semiconductor module, such as a drive converter module for the operation of a vehicle drive, in particular a motor vehicle drive. The power semiconductor module comprises an electrically insulating carrier substrate formed in a planar-like manner, with a first and a second main surface and a bridge circuit with a plurality of power switches, in particular power transistors. A first subset of one or more of the power switches is part of a first current-converting current branch of the power semiconductor module which runs between a first DC voltage contact and an AC voltage contact of the power semiconductor module. A second subset of one or more of the power switches is part of a second current-converting current branch of the power semiconductor module which runs between a second DC voltage contact, which has a polarity opposite to that of the first DC voltage contact, and the AC voltage contact of the power semiconductor module. The first current branch and the second current branch are electrically connected to the AC voltage contact in such a way that together they form a half bridge which is connected in parallel to the DC voltage contacts. In each of the two current branches, an individual current path is defined by each individual one of the associated power switches, which individual current path runs between the two DC voltage contacts and is associated with the power switch. Within at least one of the current branches, preferably within each of the current branches, the associated power switches are arranged symmetrically with respect to the DC voltage contacts and are connected in such a way that a current density which is formed in the individual current paths which are respectively assigned to one of the power switches and/or which is formed in at least one of the current branches is at least substantially homogeneously distributed during the high frequency operation of the power semiconductor module, preferably at above 10 kHz, particularly preferably at above 100 kHz, in particular at above 1 MHz, and/or during the operation of the power switches with high voltage gradients, preferably of over 10 V/ns, in particular of over 100 V/ns. At least one of the power switches is arranged on the first main surface of the carrier substrate and at least one further one of the power switches is arranged on the second main surface of the carrier substrate.

A substantially homogeneously distributed current density in the individual current paths which are respectively assigned to one of the power switches and/or in at least one of the current branches corresponds, in the sense of the invention, to a spatial distribution of the current density in which relative deviations are smaller than 25%, preferably smaller than 15%, in particular smaller than 2%.

Due to the homogeneous current density distribution in the current branches, a symmetrical loading of a power switch in at least one current path and/or of all power switches in at least one current branch can be achieved. In particular also in high frequency operation of the power semiconductor module and/or when switching the power switches with high voltage gradients, the electric current flows uniformly through all power switches or the current paths which are assigned to them, so that high frequency effects such as the skin effect and/or the proximity effect, which impair the efficiency of a power semiconductor module which is operated at high frequency, can be avoided or at least reduced.

The symmetrical loading of the power switches also leads to an increase in the service life of the power semiconductor module, since a concentration of the current flow in individual power switches, which would damage the power switches and thus the power semiconductor module, for example through a local increase in temperature, is reliably avoided.

The symmetrical arrangement and interconnection of the power switches in at least one current branch leads to the formation of a homogeneous current density distribution in the current paths during the high frequency operation of the power semiconductor module and thus also makes it possible to avoid or at least reduce a constriction of the electric current in the current paths and/or current branches.

In order to enable the homogeneous current density distribution, the supply lines from the direct current contacts or from the alternating current contact to the power switches, i.e. the current paths assigned to the power switches, preferably run substantially in parallel, in an electric sense and/or in a geometrical sense. In particular, each of the switching elements can lie in one plane with the electric current path assigned to it, whereby the planes of power switches which are electrically connected in parallel are also parallel to one another in the geometrical sense. By this measure, the constriction of electric current in the current paths can be prevented or at least reduced, even at high frequencies, such as can occur when using fast-switching power switches which are based on semiconductors with a wide band gap.

The arrangement of the power switches on the first and second main surface enables the electric current to be guided around an edge or a side surface of the module during operation of the power semiconductor module, so that the surface around which the electric current flows substantially corresponds to a cross-sectional area of the carrier substrate perpendicular to the first or the second main surface. This also enables a reduction to be achieved, in particular a minimization, of the total inductance of the power semiconductor module in accordance with the invention. By this measure, overvoltages and switching losses can at least be reduced so that a correspondingly more efficient operation of the power semiconductor module in accordance with the invention is possible.

The arrangement of the power switches and/or of the associated current paths in accordance with the invention also makes it possible to achieve a substantially homogeneous temperature distribution during operation of the power semiconductor module in accordance with the invention. The power semiconductor module, or at least its power switch, can be operated at high operating temperatures, preferably above 150° C., particularly preferably above 185° C., in particular above 200° C.

By using the first and the second main surface of the carrier substrate for the symmetrical arrangement of power switches, the installation space of the power semiconductor module available for the power switches and their supply lines can also be increased in comparison to a purely planar power semiconductor module in which the bridge circuit is formed exclusively in a two-dimensional manner on a substrate surface. Accordingly, an increased integration density of the power semiconductor module is made possible.

By manufacturing the carrier substrate, which is preferably constructed as a heat sink for dissipating heat, from an electrically insulating material, the electromagnetic compatibility of the module can also be improved, since a capacitive coupling to the carrier substrate, which is preferably constructed as a heat sink, and thus also to a housing which accommodates the carrier substrate, can be avoided or at least reduced.

Overall, the invention provides an efficient power semiconductor module with a long service life even in high frequency operation and/or in operation with high voltage gradients, in particular with a low total inductance and a homogeneous temperature distribution during operation.

In a further embodiment, the first subset of one or more of the power switches is arranged on the first main surface of the planar-like carrier substrate and the second subset of one or more of the power switches is arranged on the second main surface of the planar-like carrier substrate. By this measure, the first and the second current converting electric current branches are respectively arranged on main surfaces of the carrier substrate which are opposite to one another, by which an equal distribution of the current density in the current paths and/or current branches can be implemented particularly easily. In addition, a symmetrical connection, in particular a parallel connection in the geometric sense, of the respective power switches in the current branches can also be implemented particularly easily in this way.

This arrangement allows a 2-level module to be formed, i.e. a power semiconductor module whose output voltage on the AC voltage contact side changes between two voltage values, such as a converter based on a B6 bridge. In a further embodiment, a 3-level module can also be formed in this way, such as a bridge circuit with an I-type topology (I-type inverter), in which at least one power switch from each of the first and the second current branch is also contained in a third current branch. The power switches from the first subset are preferably arranged symmetrically, in relation to the carrier substrate, with respect to the power switches from the second subset, i. e. a power switch from the second subset is located opposite to each power switch from the first subset, so that the inductances of the current paths of each pair of opposite power switches on the first main surface and the second main surface are substantially identical. This enables a homogeneous current distribution to all power switches or supply lines and allows a constriction of the current in a plane parallel to the first main surface or the second main surface during operation of the power semiconductor module at high frequencies to be avoided or at least reduced.

In a further embodiment, a third subset of one or more of the power switches is part of a third current branch of the power semiconductor module, which third current branch runs between a third DC voltage contact with a polarity which is neutral with respect to the first and second DC voltage contacts and the AC voltage contact of the power semiconductor module. In this way, a 3-level module can be formed, i. e. a power semiconductor module whose output voltage on the AC voltage contact side changes between 3 voltage values. An intermediate circuit capacitance which is electrically connected to the DC voltage contacts comprises two intermediate circuit capacitors connected in series, between which the third DC voltage contact is arranged, so that an NPC type inverter (NPC, neutral point clamped) is formed, such as an I-type inverter or a T-type inverter in which each of the power switches is contained in only one current branch.

In this embodiment, the harmonic content of a voltage which has been converted by the power semiconductor module can be reduced when compared with a voltage which has been converted by a 2-level module, while at the same time an increase in the electromagnetic compatibility (EMC) can be achieved, since the voltage switched per time unit is halved by the two additional voltage levels.

In a further embodiment, the first subset comprises two or more of the power switches, which, in the electrical sense, are connected in parallel to one another. In addition, the second subset comprises two or more of the power switches, which, in the electrical sense, are connected in parallel to one another. If provided, the third subset may also comprise two or more of the power switches, which, in the electrical sense, are connected in parallel to one another. Within at least one of the current branches, the associated power switches are arranged and connected symmetrically with respect to the DC voltage contacts in such a way that the inductances which are formed by the current paths respectively associated to each of the individual power switches are at least substantially the same among each other.

By connecting the power switches or the associated current paths in parallel in the electrical sense and/or in the geometric sense, in particular on the first main surface of the carrier substrate or on the second main surface of the carrier substrate, substantially identical inductances can be formed in each of the current paths of a current branch. This means that all the power switches of a current branch can carry substantially the same current even in high frequency operation, which enables a particularly homogeneous distribution of the current density in the current paths and/or current branches.

In the sense of the invention, substantially equal inductances which are formed by the current paths associated with the power switches correspond to inductances with a deviation relative to one another of less than 25%, preferably less than 15%, in particular less than 2%.

In a further embodiment, the first direct current contact is arranged in a planar-like manner along a first edge of the first main surface and the second direct current contact is arranged in a planar-like manner along a second edge of the second main surface opposite the first edge of the first main surface.

Due to the planar-like formation of the direct current contacts, the intermediate circuit capacitance can be contacted in a planar-like manner and thus the commutation inductance, as it is referred to, i.e. the inductance occurring when there is a change of the current-carrying current branch, which normally causes power losses during operation of the power semiconductor module, can be reduced. In this way, an increase in the energy efficiency of the power semiconductor module can be achieved.

Due to the arrangement of the direct current contacts at the edges of the first or the second main surface the direct current contacts are positioned close to each other in space, as a result of which the area enclosed by the first and second and, if provided, also the third, current branches and thus also the total inductance of the power semiconductor module can advantageously be reduced, i.e. overvoltages and power losses in the operation of the power semiconductor module can be reduced.

In a further embodiment, the first subset of two or more of the power switches and at least one power switch from the third subset of two or more of the power switches are arranged on the first main surface of the planar-like carrier substrate, and the second subset of two or more of the power switches and at least one power switch from the third subset of two or more of the power switches is arranged on the second main surface of the planar-like carrier substrate. A portion of the power switches from the first and/or the second subset may form the third subset. This makes it possible to form a half-bridge with an I-type topology (I-type inverter). In this embodiment, power switches with a lower reverse voltage can be used than in a comparable 2-level module.

A diode is preferably arranged in each of the current paths defined by the power switches from the third subset, as a result of which the current flow between the first, second or third direct current contact and the alternating voltage contact can be controlled or conducted in such a way that the current flow between the first, second and third current branches is commutated and thereby a direct voltage present at the direct voltage contacts is converted into an alternating voltage, such as a sinusoidal voltage with a reduced harmonic content compared with a 2-level module.

In a further embodiment, the first and second subsets of two or more of the power switches are arranged on the first main surface of the planar-like carrier substrate, and the third subset of two or more of the power switches is arranged on the second main surface of the planar-like carrier substrate. In this way, a half-bridge with T-type topology (T-type inverter) can be formed. An advantage of this embodiment over an embodiment in I-type topology is that several power switches from the first, second and/or third subset of power switches can more easily be arranged and connected symmetrically, so that a structure with particularly low inductance is achieved.

The first subset of two or more of the power switches on the first main surface of the planar-like carrier substrate is preferably arranged symmetrically with respect to the second subset of two or more of the power switches on the first main surface of the planar-like carrier substrate. The first sub-set may be arranged in a first surface portion and the second sub-set in a second surface portion of the first main surface. The first surface portion and the second surface portion each occupy the same area, whereby the first and second surface portions of the first main surface are defined by an axis which preferably runs symmetrically between the first direct current contact and the second direct current contact.

In a further embodiment, the first and second direct current contacts are arranged side by side in a planar-like manner along an edge of one of the main surfaces. The third direct current contact can be arranged in a planar-like manner along an edge of the opposite main surface so that the first and second direct current contacts are located opposite the third direct current contact. In this way, an arrangement where the direct current contacts are situated close to each other, and thus a reduction of the total inductance of the power semiconductor module formed by the area surrounded by the current branches can be achieved, as a result of which power losses in the operation of the power semiconductor module can be reduced.

In a further embodiment, the planar-like carrier substrate is made of an electrically insulating material, in particular a ceramic or a plastics material, and is arranged to dissipate heat generated during operation of the power semiconductor module, in particular operation of the power switches. This allows conductive layers, such as a metallization, to be applied directly onto the carrier substrate, which is preferably constructed as a heat sink, and the power switches to be applied directly to the conductive layers, which enables the layers which are required to operate the module to be reduced. This allows the module to be made particularly flat, so that the cross-sectional area of the carrier substrate around which the current flows during operation and which is limited by the first and second main surfaces, and thus the total inductance of the module, becomes particularly small.

In particular, additional layers which impair the heat conduction, in particular between the power switches and the planar-like carrier substrate, via which planar-like carrier substrate heat can be dissipated, can be dispensed with. All in all, an electrically non-conductive carrier substrate which is constructed as a heat sink also enables an improved heat dissipation for this reason.

The planar-like carrier substrate is metallized in those areas in which the plurality of the power switches, the direct current contacts and/or the alternating current contact are located. In an embodiment, the metallization comprises a copper layer, in particular with a thickness of 100 to 1500 μm, preferably of 250 to 1000 μm, preferably of 500 μm. The metallization can be applied directly to the carrier substrate within the framework of a DCB (direct copper bonding) process or an AMB (active metal brazing) process, for example. As a result of this, the thermal resistance which is caused by the metallization between the power switches and the carrier substrate can be substantially halved, in particular reduced to below 0.5 K/W, preferably to below 0.4 K/W, preferably to below 0.3 K/W, when compared with the thermal resistance which is formed by layer structures between the power switches and a conventional electrically conductive carrier substrate.

An electrical contact to the power switches can be constructed in the form of contact tabs, in particular bonding wires, which connect the power switches to another metallized region.

In a further embodiment, the carrier substrate has a first side surface between the first and second main surfaces, on which first side surface the alternating current contact is arranged. As a result of this, the current paths of the current branches can be made symmetrical in a simple manner, so that they have substantially the same inductance.

The alternating current contact is preferably formed by a metallization, in particular a copper layer, of the side surface. In an alternative embodiment, the alternating current contact is formed by a connection lug which reaches around the first side surface and which contacts a metallized region on each of the first and second main surfaces.

In a further embodiment, the carrier substrate has a second side surface, in particular located opposite the first side surface, between the first and the second main surfaces, on which second side surface an intermediate circuit capacitance can be arranged. As a result of this, in particular in connection with direct current contacts which are arranged on the second side surface, in particular in a planar-like manner at an edge of the second side surface, a flat construction of the power semiconductor module can be achieved, in which the area enclosed by the current paths of the current branches and thus the total inductance of the power semiconductor module is reduced in comparison with power semiconductor modules which are constructed in a planar manner.

In a further embodiment, the first direct current contact comprises a first electrically conductive spring device and the second direct current contact comprises a second electrically conductive spring device, and the intermediate circuit capacitance is arranged between the first spring device and the second spring device. The intermediate circuit capacitance may be connected to the first and second direct current contacts via the first and second spring devices. In this way, the mechanical stability of the power semiconductor module can be increased when compared with fixed connections, in particular material-bonded connections, of the intermediate circuit capacitance to the direct current contacts when the power semiconductor module expands thermally during operation.

In a further embodiment, the planar-like carrier substrate has a metallized first region on the first main surface in which at least one of the power switches is arranged, and a metallized second region on the second main surface in which at least one further power switch is arranged, wherein the first metallized region is connected in an electrically conductive manner to the second metallized region via an electrical connection which extends through the planar-like carrier substrate. This through-hole plating, as it is referred to, promotes the possibilities of a symmetrical arrangement and interconnection of the power switches from the first and second subsets and, if provided, also the third subset, so that the inductances formed by the current paths are substantially equal in magnitude. In particular, a surface enclosed by the current paths during commutation of the current branches, and thus also the corresponding inductance, can be reduced by the through-hole plating when compared with the enclosed surface of arrangements and connection schemes of the power switches in a power semiconductor module without through-hole plating.

In a further embodiment, an attenuation capacitance which neutralizes interfering high frequencies or voltage peaks is arranged in at least one of the current branches. The commutation inductance can be further reduced by incorporating a snubber, as it is referred to. In addition, voltage rise rates at the power switches can be limited.

In a further embodiment, the planar-like carrier substrate has a cooling channel in a region of at least one of the power switches through which cooling channel a cooling medium can flow in order to cool the at least one of the power switches. This allows heat which is generated in or on the power switches during operation of the power semiconductor module to be reliably and effectively dissipated. This embodiment is particularly advantageous if the power switches on the first main surface are arranged symmetrically with respect to the power switches on the second main surface, i.e. if each power switch on the first main surface is arranged opposite a respective power switch on the second main surface. In this case, a cooling channel for guiding a cooling medium can be used to dissipate heat from at least two power switches facing each other, by which the number of cooling channels can substantially be halved when compared with a power semiconductor module constructed in a planar manner with the same number of power switches.

Alternatively, the power switches on the first main surface can be arranged offset with respect to the power switches on the second main surface. As a result of this, the heat which is generated by the power switches during operation of the module is distributed over a larger area and allows a more homogeneous temperature distribution.

In a further embodiment, the cooling channel comprises, in the region of the at least one of the power switches, a means for conveying a turbulent flow of the cooling medium flowing through the cooling channel, so that, when cooling medium flows through the at least one cooling channel under predetermined flow conditions of the cooling medium, in particular with a predetermined flow velocity and/or viscosity, or Reynolds number, a turbulent flow forms in the region of the at least one of the power switches and a laminar flow forms in a further region. As a result of this, the heat which is generated in the power switches during operation of the power semiconductor module can be dissipated particularly effectively by the turbulent flow, while, due to the further region with the substantially laminar flow, the energy required to maintain the flow, which is thus only partially turbulent, can be reduced in comparison with a completely turbulent flow. As a result of this, the power semiconductor module can be operated efficiently.

A second embodiment of the invention relates to a method of manufacture for a power semiconductor module, in particular a drive converter module for operating a vehicle drive, such as that described above, the method including several manufacturing steps. The method includes manufacturing a planar-like carrier substrate having a first and a second main surface; providing a plurality of power switches; and mounting and interconnecting, in particular contacting, at least one of the power switches on the first main surface of the carrier substrate and at least one further one of the power switches on the second main surface of the carrier substrate so that a first subset of one or more of the power switches forms part of a first current branch of the power semiconductor module which first current branch extends between a first DC voltage contact and an AC voltage contact of the power semiconductor module. In addition, as a result of this, a second subset of one or more of the power switches preferably forms part of a second current branch of the power semiconductor module, which second current branch extends between a second DC voltage contact, of opposite polarity to the first DC voltage contact, and the AC voltage contact of the power semiconductor module. The first current branch and the second current branch are connected to the AC voltage contact in such a way that together they form a half-bridge connected in parallel with the DC voltage contacts, wherein in each of the two current branches, by each individual one of the associated power switches, an individual current path is defined which runs between the two direct voltage contacts and which is assigned to the power switch, and within at least one of the current branches, preferably within each of the current branches, the associated power switches are arranged and connected symmetrically with respect to the DC voltage contacts in such a way that a current density which is formed, during high frequency operation of the power semiconductor module, preferably at over 10 kHz, particularly preferably at over 100 kHz, in particular at over 1 MHz, and/or in the operation of the power switches with high voltage gradients, preferably of over 10 V/ns, in particular of over 100 V/ns, in the individual current paths which are respectively assigned to one of the power switches and/or in at least one of the current branches is at least substantially homogeneously distributed.

Preferably the carrier substrate is metallized, in particular by the application of a copper layer. In particular, the metallization can be applied by a DCB process (direct copper bonding process), an AMB process (active metal brazing process), thick-film technology or rapid prototyping or 3D printing.

In an embodiment, a first substrate portion of the planar-like carrier substrate, which first substrate portion comprises the first main surface, and a second substrate portion of the planar-like carrier substrate, which second substrate portion comprises the second main surface, are produced. Thereafter, the power switches can be applied and interconnected and the two substrate portions can be joined together, in particular by post-sintering with slurry, adhesive bonding, soldering or sintering. In this way, the plurality of power switches can be applied to the first or second main surface of the carrier substrate by a manufacturing device which is set up for the production of purely planar power semiconductor modules.

The first and/or the second substrate portion of the carrier substrate preferably comprises a cooling channel or respectively a portion of a cooling channel through which a cooling medium can flow. As both substrate parts are manufactured separately, the cooling channel can easily be provided with a means for conveying a turbulent flow, in particular in the region of at least one of the power switches.

In a further embodiment, the power switches are applied to the first main surface and the second main surface of the carrier substrate and connected, in particular contacted, by sintering. Electrically conductive connections, such as bonding wires or lead frames, can also be applied to the carrier substrate, between the power switches and/or electrically conductive layers on the carrier substrate, or connected to the power switches and/or the electrically conductive layers, by sintering. During the course of this, the power switches are preferably connected in an electrically conducting manner to a metallization, in particular metallized regions, on the carrier substrate by sintering. This is advantageous over a soldering process for connecting the power switches to the metallization, since already existing solder layers and/or solder contacts can soften, in particular on an opposite main surface of the carrier substrate, due to the heating of the carrier substrate which occurs during soldering.

By sintering the power semiconductors onto an upper surface of an electrically conductive layer, the underside of which is connected to the carrier substrate, a particularly thin module can be provided, so that the inductance, which is at least partly determined by a cross-section through the module, is particularly small.

A third embodiment of the invention relates to a vehicle, in particular a motor vehicle, with a vehicle drive, which, for the purpose of current conversion, includes a power semiconductor module as described above.

The features and advantages which have been described in relation to the first embodiment of the invention and its advantageous implementation can also be achieved by the second embodiment of the invention and its advantageous implementation and vice versa.

BRIEF DESCRIPTION OF THE DRAWINGS

Various additional features and advantages of the invention will become more apparent to those of ordinary skill in the art upon review of the following detailed description of one or more illustrative embodiments taken in conjunction with the accompanying drawings. The accompanying drawings, which are incorporated in and constitute a part of this specification, illustrates one or more embodiments of the invention and, together with the general description given above and the detailed description given below, explains the one or more embodiments of the invention.

DETAILED DESCRIPTION

Figure 1:
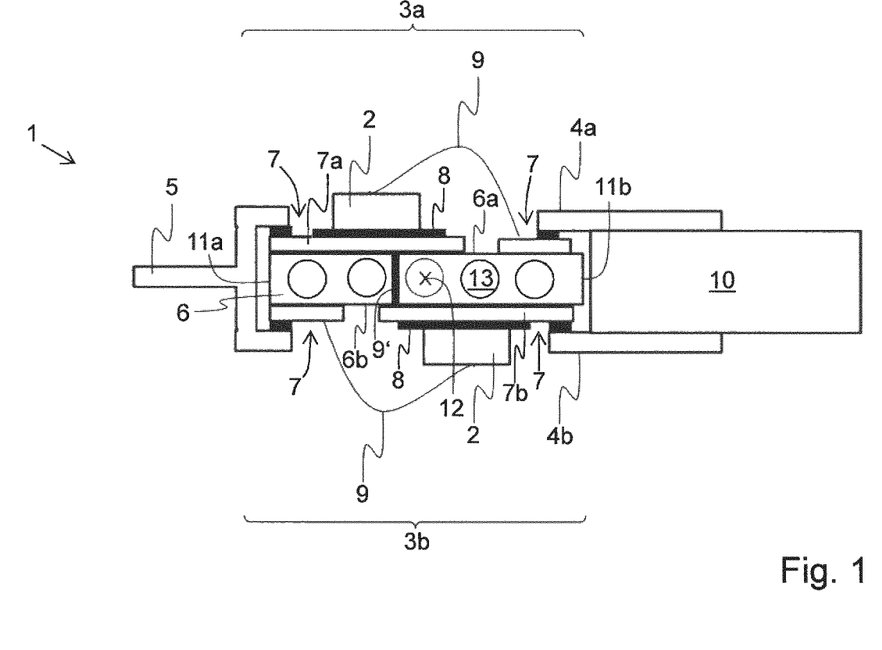
FIG. 1 is a schematic side view of one embodiment of a power semiconductor module according to the invention.

An example embodiment of a power semiconductor module 1 with power switches 2 is shown in FIG. 1 in a side view, whereby the power switches 2 are each arranged in a respective current branch 3a, 3b. The current branches 3a, 3b extend between a first direct voltage contact 4a, such as for example a positive contact, and an alternating voltage contact 5 on a first main surface 6a of a planar-like carrier substrate 6 or between a second direct voltage contact 4b, such as for example a negative contact, and the alternating voltage contact 5 on a second main surface 6b of carrier substrate 6.

The current branches 3a, 3b are composed of the power switches 2 and the respective electrical lines to there and from there, i. e. the electrical connections from the power switches 2 to the DC voltage contacts 4a, 4b and the AC voltage contact 5. The electrical lines to there and from there are formed at least in part by a metallization 7, in particular a copper layer about 500 µm thick, which is applied to the carrier substrate 6 made of an electrically insulating material as part of the manufacturing process.

The power switches 2, the DC voltage contacts 4a, 4b and the AC voltage contact 5 may be soldered onto the metallization 7 and/or formed by the latter. The corresponding solder layer 8 preferably has a thickness of 40 to 120 µm, preferably 60 to 100 µm, in particular about 80 µm.

Alternatively, the power switches 2, the DC voltage contacts 4a, 4b and the AC voltage contact 5 can be applied onto metallization 7 by sintering. By the corresponding sintering process, the carrier substrate 6 can particularly easily be provided, on both main surfaces 6a, 6b, with the components mentioned above, without there being a need for complicated two-sided soldering processes.

The metallization 7 preferably consists of several metallized regions 7a, 7b on each of the main surfaces 6a, 6b, which metallized regions 7a, 7b can be electrically connected to each other for example by bonding wires 9 or lead frames (not shown). In an embodiment, one or more damping capacitors (not shown), such as snubbers, as they are referred to, may also be included or arranged in the current branches 3a, 3b. Alternatively or additionally, the metallized regions 7a, 7b can be electrically connected to each other via an electrically conductive connection 9', which is guided through the carrier substrate 6.

The AC voltage contact 5 is constructed as a connection tab which reaches around a first side surface 11a of the carrier substrate 6 and contacts a metallized region respectively on the first and the second main surface 6a, 6b. Alternatively, the AC voltage contact 5 can however also be formed by a metallized region on the first side surface 11a which extends around the edges between the first side surface 11a and the first or second main surface 6a, 6b, respectively.

Arranged on a second side surface 11b of the carrier substrate 6, which second side surface 11b is located between the first main surface 6a and the second main surface 6b and in particular opposite the first side surface 11a, is an intermediate circuit capacitance 10, such as a capacitor, and is electrically connected on the one hand to the first DC voltage contact 4a and on the other hand to the second DC voltage contact 4b. In this way, the power switches 2 which are arranged on the first and the second main surface 6a, 6b, together with the intermediate circuit capacitance 10 form a half-bridge, wherein a respective half of the half-bridge is arranged on each of the first main surface 6a and on the second main surface 6b.

The arrangement of power switches 2, DC voltage contacts 4a, 4b, AC voltage contact 5 and intermediate circuit capacitance 10 shown in FIG. 1 enables the two halves of the half-bridge to be constructed substantially symmetrically with respect to one another, i.e. the power switches 2 and lines to these and from these made from bonding wires 9 and metallized regions or the current branches 3a, 3b to be arranged substantially symmetrically, in particular mirror symmetrically or rotationally symmetrically with respect to a point or an axis 12.

Figure 2:
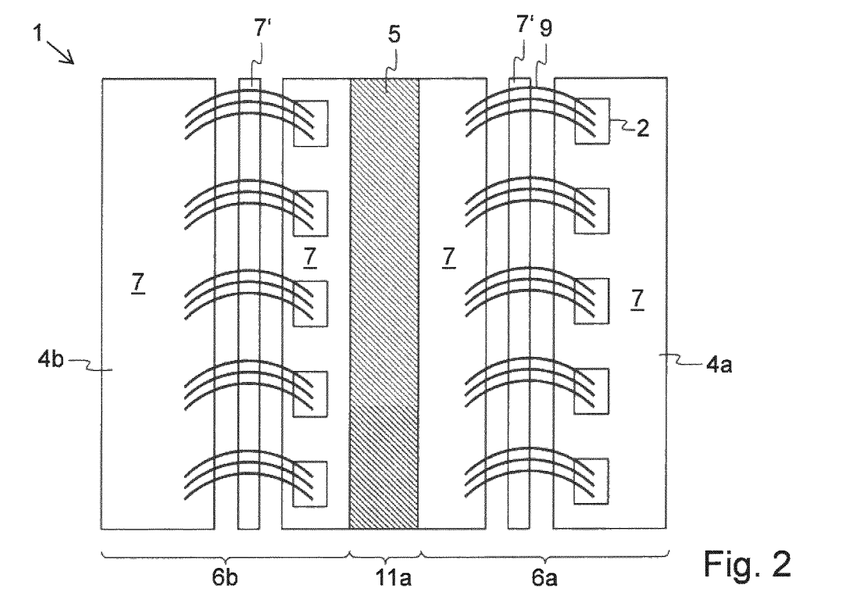
FIG. 2 shows one embodiment of a 2-level module in an unwound form that may be used with the invention.

In this arrangement, the power semiconductor module 1 can easily be scaled with respect to the number of power switches 2 by constructing the DC voltage contacts 4a, 4b, the AC voltage contact 5 and the metallization 7 in a planar-like manner in a direction perpendicular to the image plane, so that several power switches 2 can be arranged next to each other in this direction and can easily be electrically connected in parallel (see e.g. FIG. 2). In this way, the inductance of the individual current paths formed in this way, which together form the current branches 3a, 3b, can be kept equal and in particular low, so that a homogeneous current density distribution is achieved in the individual current paths and the power semiconductor module can convert a higher power during operation. The electric current does not have to be guided in the direction perpendicular to the image plane either, as a result of which, in high frequency operation, current constriction in planes perpendicular to the image plane can also be avoided.

In order to enable the use of power switches 2 which operate at high operating temperatures, the carrier substrate 6 comprises several cooling channels 13 through which a cooling medium can flow in order to remove the heat generated during operation of the power semiconductor module 1.

An example embodiment of a power semiconductor module 1 constructed as a 2-level module is shown in FIG. 2 in an unwound form, where a first main surface 6a, a second main surface 6b and a first side surface 11a of a planar-like carrier substrate are shown "folded out" next to each other in order to provide a better illustration.

The carrier substrate is provided with a metallization 7 on the main surfaces 6a, 6b and the first side surface 11a in such a way that different electrically conductive regions are formed. In a respective region on each of the first and second main surfaces 6a, 6b, power switches 2 are arranged which are electrically connected in parallel and which are electrically connected to another metallized region via bonding wires 9. The areas 7' spanned by the bonding wires 9 are used to control the power switches 2, in particular when field effect transistors, IGBTs and/or the like are used as power switches 2 as their gate contact.

The areas 7' can also be metallized. Alternatively, the areas 7' can also be formed by circuit boards connected to the carrier substrate, in particular glued to the carrier substrate, which circuit boards are set up to control the power switches 2 and which can be connected to a power switch driver (not shown) outside the module 1.

The metallized region along an edge of the carrier substrate on the first main surface 6a forms a planar-like first DC voltage contact 4a, from which electric current can flow uniformly via the power switches 2 arranged in this area to the first side surface 11a. The metallized region on the first side surface 11a forms an AC voltage contact 5.

Likewise, the metallized region forms a planar-like second DC voltage contact 4b along one edge of the carrier substrate on the second main surface 6b, from which planar-like second DC voltage contact 4b electric current can flow uniformly via the power switches 2 on the second main surface 6b to the first side surface 11a. Each of the first and second DC voltage contacts 4a, 4b are electrically connected to a respective intermediate circuit capacitance (not shown).

By the arrangement shown, in which the DC voltage contacts 4a, 4b are located on opposite main surfaces 6a, 6b of the carrier substrate, a 2-level module, in particular a B6 inverter, with several power transistors connected in parallel in order to increase the current carrying capacity can be formed. Due to the symmetrical arrangement on the first and second main surfaces 6a, 6b, a uniform current distribution to the power transistors results, whereby the total inductance of the module remains low due to the flat construction (intermediate circuit capacitance can be connected to the DC voltage contacts 4a, 4b on a second side surface (not shown) opposite the first side surface 11a).

An example embodiment of a power semiconductor module 1 constructed as a T-type inverter is shown in a plan view in FIG. 3, where again a first main surface 6a, a second main surface 6b and a first side surface 11a of a planar-like carrier substrate are shown "folded out" next to each other in order to provide a better illustration.

Figure 3:
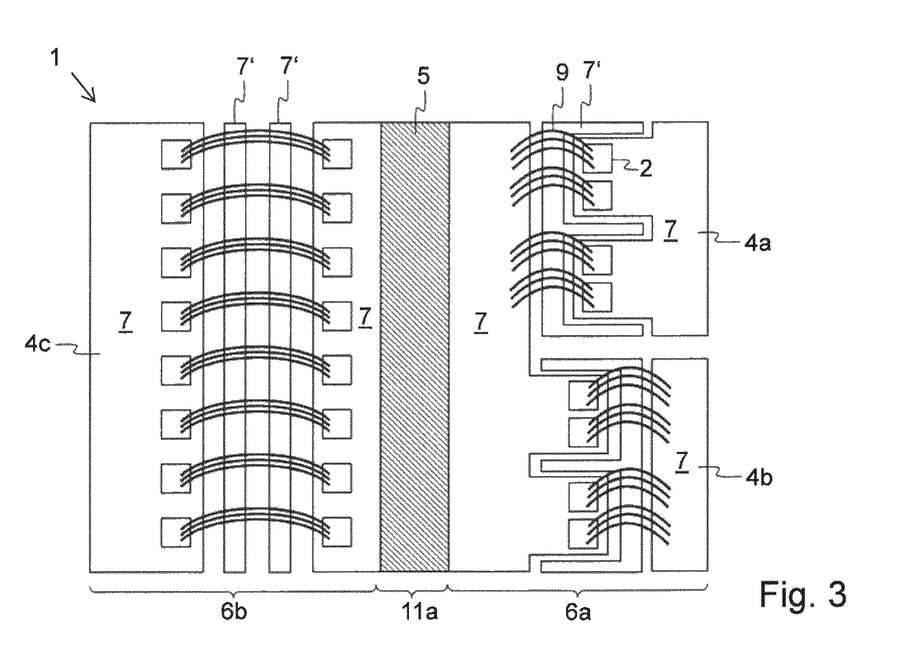
FIG. 3 shows one embodiment of a T-type inverter that may be used with the invention.

Different areas of the carrier substrate are provided with a metallization 7 in this example embodiment as well. The metallization 7 is applied in such a way that a first DC voltage contact 4a, such as a positive contact, and a second DC voltage contact 4b, such as a negative contact, are formed along an edge on the first main surface 6a. The DC voltage contacts 4a, 4b are connected in an electrically conducting manner to a further metallized region on the first main surface 6a via bonding wires 9 and power switch 2, which further metallized region merges into a metallized region arranged on the first side surface 11a and forming an AC voltage contact 5.

On the second main surface 6b, a metallized region forms a third DC voltage contact 4c, such as a contact which is neutral with respect to the positive contact and the negative contact, at which neutral contact substantially no voltage is present when connected to an electrical machine during operation of the module, which neutral contact is also connected in an electrically conducting manner to a further metallized region on the second main surface 6b via bonding wires 9 and power switch 2, which further metallized region merges into the AC voltage contact 5 on the first side surface 11a. The areas 7' spanned by the bonding wires 9 form the contacts for controlling the power switch 2 here as well and can be formed by a metallization or by circuit boards for controlling the power switches 2.

By the arrangement shown, a 3-level module, in particular in T-type topology, can be formed.

An example embodiment of a power semiconductor module 1 constructed as an I-type inverter is shown in a plan view in FIG. 4, where again a first main surface 6a, a second main surface 6b and a first side surface 11a of a planar-like carrier substrate are shown "folded out" next to each other in order to provide a better illustration.

Figure 4:
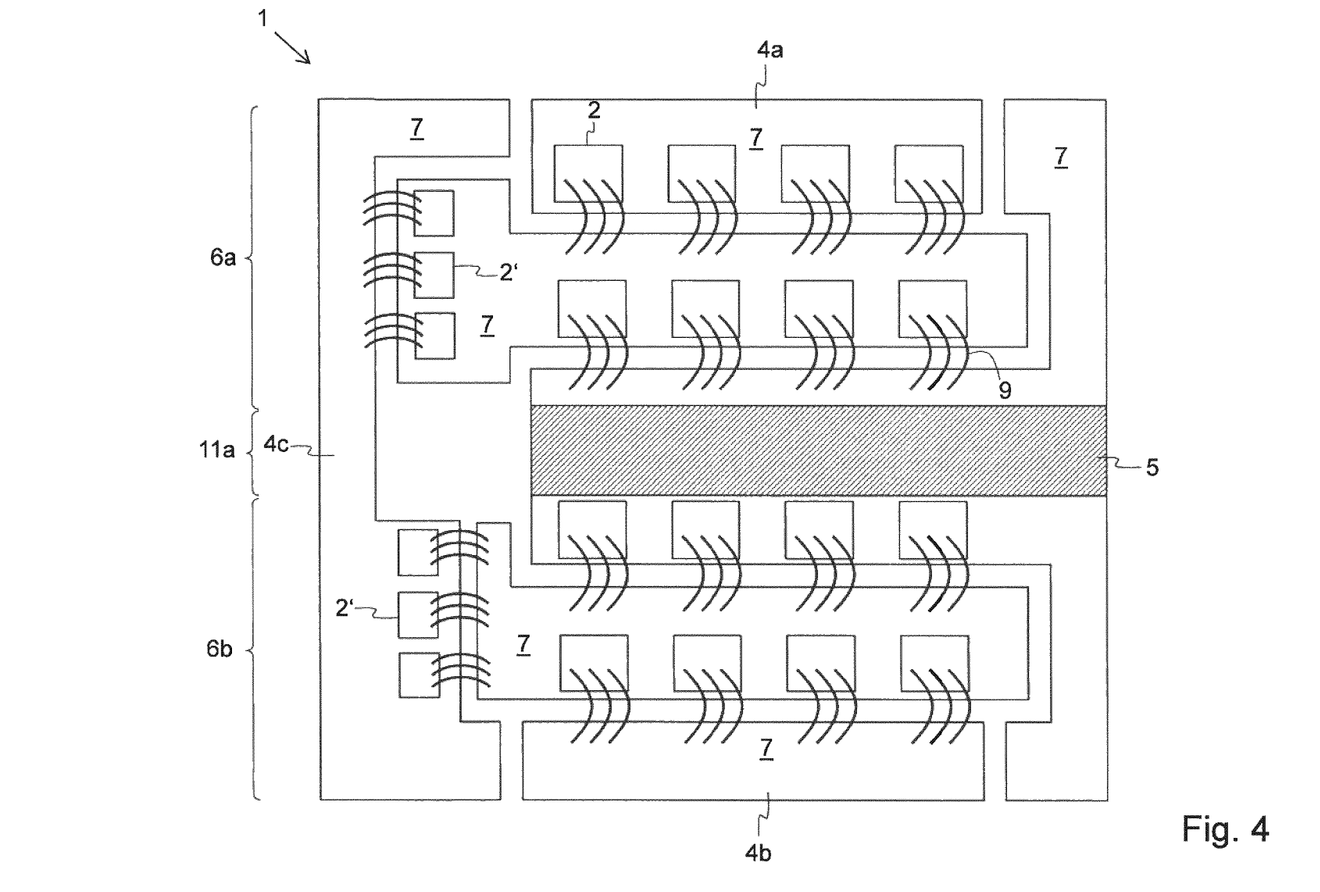
FIG. 4 shows one embodiment of an I-type inverter that may be used with the invention.

In analogy to the example embodiments shown in FIGS. 3 and 4, the carrier substrate is metallized in such a way that different conductive areas are formed on the first main surface 6a, the second main surface 6b and the first side surface 11a of the carrier substrate.

On the first main surface 6a, along an edge of the carrier substrate, a metallization 7 forms a first DC voltage contact 4a, such as a positive contact, which is connected in an electrically conducting manner to a further metallized region on the first main surface 6a via bonding wires 9 and power switch 2, which merges into a metallized region on the first side surface 11a. The metallization 7 on the first side surface 11a forms an AC voltage contact 5.

On the second main surface 6b, along an edge of the carrier substrate, a metallization 7 forms a second DC voltage contact 4b, such as a negative contact, which is connected in an electrically conductive manner to a further metallized region on the second main surface 6b via bonding wires 9 and power switch 2. This further region merges into the AC voltage contact 5 on the first side surface 11a.

A further metallized region is arranged on the first main surface 6a, which further metallized region extends over the first side surface 11a to the second main surface 6b and which forms a third DC voltage contact 4c, such as a contact which is neutral with respect to the positive contact and the negative contact. The third DC voltage contact 4c is also connected in an electrically conducting manner to the AC voltage contact 5 via bonding wires 9, diodes 2' and power switch 2.

By the arrangement shown, a 3-level module, in particular in I-type topology, can be formed. For reasons of clarity, not shown are circuit boards for controlling the gates of the power switches 2 and extending between the metallized regions shown.

The embodiments described above are only descriptions of preferred embodiments of the present invention, and are not intended to limit the scope of the present invention. Various variations and modifications can be made to the technical solution of the present invention by those of ordinary skills in the art, without departing from the design and spirit of the present invention. The variations and modifications should all fall within the claimed scope defined by the claims of the present invention.

LIST OF REFERENCE SIGNS 1 power semiconductor module
2 power switch
3a, 3b current branches
4a, 4b, 4c first, second and third DC voltage contact
5 AC voltage contact
6 carrier substrate
6a, 6b first and second main surface
7 metallization
8 solder layer
9 bonding wire
10 intermediate circuit capacitance
11a, 11b first and second side surface
12 point of symmetry
13 cooling channel

What is claimed is:

1. A power semiconductor module defining a drive converter module for operation of a vehicle drive, comprising:
an electrically insulating carrier substrate formed in a planar-like manner and having a first and a second main surface;
a bridge circuit which comprises a plurality of power switches;
wherein a first subset of one or more of the power switches is part of a first current branch of the power semiconductor module which extends between a first DC voltage contact and an AC voltage contact of the power semiconductor module; and
a second subset of one or more of the power switches is part of a second current branch of the power semiconductor module which runs between a second DC voltage contact, which has a polarity opposite to that of the first DC voltage contact, and the AC voltage contact of the power semiconductor module;
wherein the first current branch and the second current branch are electrically connected at the AC voltage contact in such a way that together they form a half-bridge which is connected in parallel to the first and second DC voltage contacts;
wherein in each of the two current branches, an individual current path is defined by each individual one of the power switches associated therewith, which individual current path runs between the two DC voltage contacts and is assigned to the power switch; and
wherein within the two current branches, the associated power switches are arranged symmetrically with respect to the first and second DC voltage contacts and are connected in such a way that:

a) a current density which is formed in the individual current paths which are respectively assigned to one of the power switches is at least substantially homogeneously distributed during the high frequency operation of the power semiconductor module, at above 10 kHz, and/or during the operation of the power switches with high voltage gradients, of over 10 V/ns; and b) inductances which are formed by the individual current paths respectively associated to each of the individual power switches are at least substantially the same among each other; and at least one of the power switches is arranged on the first main surface of the carrier substrate and at least one further one of the power switches is arranged on the second main surface of the carrier substrate.

2. The power semiconductor module of claim 1, wherein the first subset of one or more of the power switches is arranged on the first main surface of the planar-like carrier substrate and the second subset of one or more of the power switches is arranged on the second main surface of the planar-like carrier substrate.

3. The power semiconductor module of claim 1, wherein a third subset of one or more of the power switches is part of a third current branch of the power semiconductor module, which third current path runs between a third DC voltage contact with a polarity which is neutral with respect to the first and second DC voltage contacts and the AC voltage contact of the power semiconductor module.

4. The power semiconductor module of claim 3, wherein the first subset comprises two or more of the power switches, which, in an electrical sense, are connected in parallel to one another, and the second subset comprises two or more of the power switches, which, in an electrical sense, are connected in parallel to one another, and, if provided, the third subset comprises two or more of the power switches, which, in an electrical sense, are connected in parallel to one another.

5. The power semiconductor module of claim 1, wherein the first DC voltage contact is arranged in a planar-like manner along a first edge of the first main surface and the second DC voltage contact is arranged in a planar-like manner along a second edge of the second main surface which is located opposite the first edge of the first main surface.

6. The power semiconductor module of claim 4, wherein the first subset of two or more of the power switches and at least one power switch from the third subset of two or more of the power switches are arranged on the first main surface of the planar-like carrier substrate, and the second subset of two or more of the power switches and at least one power switch from the third subset of two or more of the power switches is arranged on the second main surface of the planar-like carrier substrate.

7. The power semiconductor module of claim 4, wherein the first and second subsets of two or more of the power switches are arranged on the first main surface of the planar-like carrier substrate, and the third subset of two or more of the power switches is arranged on the second main surface of the planar-like carrier substrate.

8. The power semiconductor module of claim 7, wherein the first and second DC voltage contacts are arranged side by side in a planar-like manner along an edge of one of the main surfaces.

9. The power semiconductor module of claim 1, wherein the carrier substrate has a first side surface between the first and second main surfaces, on which first side surface the AC voltage contact is arranged.

10. The power semiconductor module of claim 1, wherein the carrier substrate has a second side surface between the first and second main surfaces, on which second side surface an intermediate circuit capacitance can be arranged.

11. The power semiconductor module of claim 1, wherein the planar-like carrier substrate has a metallized first region on the first main surface in which at least one of the power switches is arranged, and a metallized second region on the second main surface in which at least one further power switch is arranged, and wherein the first metallized region is connected in an electrically conductive manner to the second metallized region via an electrical connection which extends through the planar-like carrier substrate.

12. The power semiconductor module of claim 1, wherein the planar-like carrier substrate has, in a region of at least one of the power switches, a cooling channel through which a cooling medium for cooling the at least one of the power switches can flow.

13. A method of manufacture for a power semiconductor module defining a drive converter module for operating a vehicle drive, the method comprising:

manufacturing an electrically insulating, planar-like carrier substrate having a first and a second main surface;

providing a plurality of power switches; and mounting and interconnecting at least one of the power switches on the first main surface of the carrier substrate and at least one further one of the power switches on the second main surface of the carrier substrate, so that a first subset of one or more of the power switches forms part of a first current branch of the power semiconductor module which first current branch extends between a first DC voltage contact and an AC voltage contact of the power semiconductor module;

a second subset of one or more of the power switches forms part of a second current branch of the power semiconductor module which second current branch extends between a second DC voltage contact, of opposite polarity to the first DC voltage contact, and the AC voltage contact of the power semiconductor module;

the first current branch and the second current branch are connected to the AC voltage contact in such a way that together they form a half-bridge connected in parallel with the first and second DC voltage contacts;

wherein in each of the two current branches, by each individual one of the power switches associated therewith, an individual current path is defined which runs between the first and second DC voltage contacts and which is assigned to the power switch; and wherein within the two current branches, the associated power switches are arranged symmetrically with respect to the first and second DC voltage contacts and are connected in such a way that:

a) a current density which is formed in the individual current paths which are respectively assigned to one of the power switches is at least substantially homogeneously distributed during the high frequency operation of the power semiconductor module, at above 10 kHz, and/or during the operation of the power switches with high voltage gradients, of over 10 V/ns; and b) inductances which are formed by the individual current paths respectively associated to each of the individual power switches are at least substantially the same among each other.

14. The method of manufacture of claim 13, wherein the power switches are applied to the first main surface and the second main surface of the carrier substrate and connected by sintering.

15. A vehicle, in particular a motor vehicle, having a vehicle drive which is operated by a power semiconductor module of claim 1.

16. The method of claim 13, wherein within the two current branches, the associated power switches are connected in such a way that the current density which is formed in the individual current paths which are respectively assigned to one of the power switches is at least substantially homogeneously distributed during the high frequency operation of the power semiconductor module, at above 100 kHz, and/or during the operation of the power switches with high voltage gradients, of over 100 V/ns.

17. The method of claim 13, wherein within the two current branches, the associated power switches are connected in such a way that the current density which is formed in the individual current paths which are respectively assigned to one of the power switches is at least substantially homogeneously distributed during the high frequency operation of the power semiconductor module, at above 1 MHz, and/or during the operation of the power switches with high voltage gradients, of over 100 V/ns.

18. The power semiconductor module of claim 1, wherein within the two current branches, the associated power switches are connected in such a way that the current density which is formed in the individual current paths which are respectively assigned to one of the power switches is at least substantially homogeneously distributed during the high frequency operation of the power semiconductor module, at above 100 kHz, and/or during the operation of the power switches with high voltage gradients, of over 100 V/ns.

19. The power semiconductor module of claim 1, wherein within the two current branches, the associated power switches are connected in such a way that the current density which is formed in the individual current paths which are respectively assigned to one of the power switches is at least substantially homogeneously distributed during the high frequency operation of the power semiconductor module, at above 1 MHz, and/or during the operation of the power switches with high voltage gradients, of over 100 V/ns.

20. The power semiconductor module of claim 1, wherein the first subset of one or more of the power switches is arranged on the first main surface of the planar-like carrier substrate and the second subset of one or more of the power switches is arranged on the second main surface of the planar-like carrier substrate;
wherein a third subset of one or more of the power switches is part of a third current branch of the power semiconductor module, which third current path runs between a third DC voltage contact with a polarity which is neutral with respect to the first and second DC voltage contacts and the AC voltage contact of the power semiconductor module;
wherein the first subset comprises two or more of the power switches, which, in the electrical sense, are connected in parallel to one another, and the second subset comprises two or more of the power switches, which, in the electrical sense, are connected in parallel to one another, and, if provided, the third subset comprises two or more of the power switches, which, in the electrical sense, are connected in parallel to one another;
wherein the first DC voltage contact is arranged in a planar-like manner along a first edge of the first main surface and the second DC voltage contact is arranged in a planar-like manner along a second edge of the second main surface which is located opposite the first edge of the first main surface;
wherein the first subset of two or more of the power switches and at least one power switch from the third subset of two or more of the power switches are arranged on the first main surface of the planar-like carrier substrate, and the second subset of two or more of the power switches and at least one power switch from the third subset of two or more of the power switches is arranged on the second main surface of the planar-like carrier substrate;
wherein the first and second subsets of two or more of the power switches are arranged on the first main surface of the planar-like carrier substrate, and the third subset of two or more of the power switches is arranged on the second main surface of the planar-like carrier substrate;
wherein the first and second DC voltage contacts are arranged side by side in a planar-like manner along an edge of one of the main surfaces;
wherein the carrier substrate has a first side surface between the first and second main surfaces, on which first side surface the AC voltage contact is arranged;
wherein the carrier substrate has a second side surface between the first and second main surfaces, on which second side surface an intermediate circuit capacitance can be arranged;
wherein the planar-like carrier substrate has a metallized first region on the first main surface in which at least one of the power switches is arranged, and a metallized second region on the second main surface in which at least one further power switch is arranged, and wherein the first metallized region is connected in an electrically conductive manner to the second metallized region via an electrical connection which extends through the planar-like carrier substrate;
wherein the planar-like carrier substrate has, in a region of at least one of the power switches, a cooling channel through which a cooling medium for cooling the at least one of the power switches can flow.

21. The power semiconductor module of claim 1, further comprising an intermediate circuit capacitance having two contacts, wherein each of the two contacts of the intermediate circuit capacitance is connected to a respective one of the first and second DC voltage contacts.

22. The power semiconductor module of claim 1, wherein:
the current density which is formed in the individual current paths which are respectively assigned to one of the power switches corresponds to a spatial distribution of the current density in which relative deviations are smaller than 25%; and
the inductances which are formed by the individual current paths respectively associated to each of the individual power switches have a deviation relative to one another of less than 25%.

* * * * *